(12) United States Patent
Tien

(10) Patent No.: US 12,078,658 B2
(45) Date of Patent: Sep. 3, 2024

(54) SEMICONDUCTOR PROBE

(71) Applicant: Chien Cheng Tien, Hsin Chu (TW)

(72) Inventor: Chien Cheng Tien, Hsin Chu (TW)

( * ) Notice: Subject to any disclaimer, the term of this patent is extended or adjusted under 35 U.S.C. 154(b) by 514 days.

(21) Appl. No.: 17/238,130

(22) Filed: Apr. 22, 2021

(65) Prior Publication Data

US 2021/0333309 A1    Oct. 28, 2021

Related U.S. Application Data

(60) Provisional application No. 63/014,105, filed on Apr. 22, 2020.

(51) Int. Cl.
*G01R 1/06* (2006.01)
*G01R 1/067* (2006.01)
*G01R 1/073* (2006.01)

(52) U.S. Cl.
CPC ..... *G01R 1/07342* (2013.01); *G01R 1/06761* (2013.01)

(58) Field of Classification Search
CPC .................................................. G01R 1/06761
See application file for complete search history.

(56) References Cited

U.S. PATENT DOCUMENTS

| | | | |
|---|---|---|---|
| 2012/0313766 A1* | 12/2012 | Chappaz | H10N 30/206 340/407.1 |
| 2015/0369843 A1* | 12/2015 | Ben Jamaa | H10N 30/2042 29/25.35 |

* cited by examiner

*Primary Examiner* — Jeremy C Norris
(74) *Attorney, Agent, or Firm* — Chun-Ming Shih; LANWAY IPR SERVICES

(57) ABSTRACT

A semiconductor probe includes multiple metal layers. An oxide layer is disposed between each adjacent pair of the metal layer. A via for connecting at least one pair of the metal layers. At least one protection layer 150 is disposed at an external side of the metal layer.

16 Claims, 17 Drawing Sheets

SEMICONDUCTOR PROBE

FIELD

The present invention is related to a probe and particularly related to a probe used in semiconductor processing.

BACKGROUND

A conventional probe card performs necessary tests on manufactured semiconductor integrated circuit packages for confirming yields of such semiconductor integrated circuit packages. However, such conventional probe card's probes may not be strong enough to survive highly repeated usage. For example, the probes may deform themselves because of such highly repeated usage.

SUMMARY

The present invention directs to semiconductor probes that have long life span.

For neutralizing the abovementioned deformation of probes, the present disclosure discloses a robust structured probe that is capable of resisting highly repeated usage.

DETAILED DESCRIPTION

Figure 1:
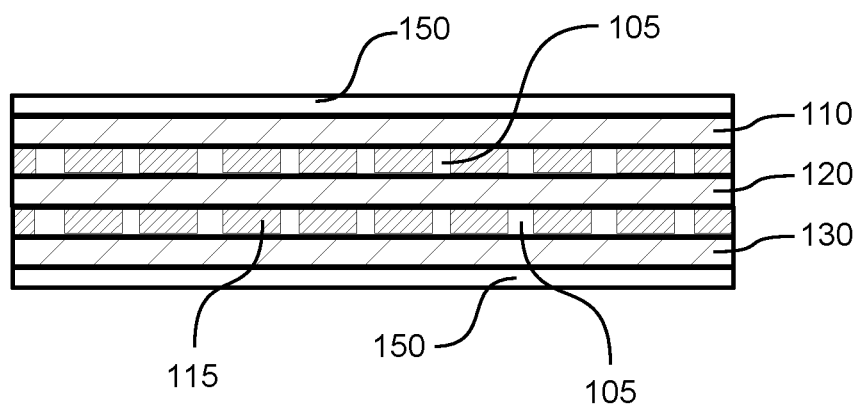
FIG. 1 illustrates a schematic lateral view of an exemplary probe structure.
Figure 2:
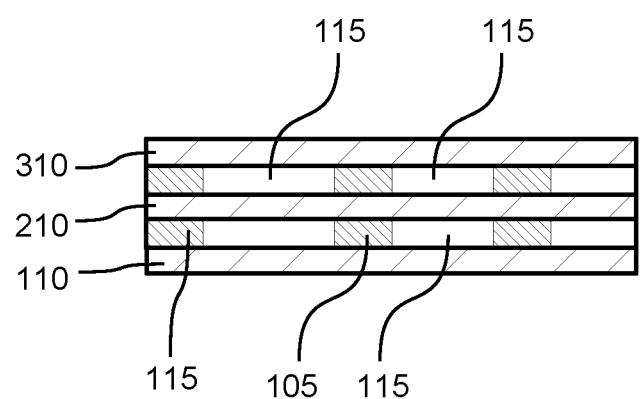
FIG. 2 illustrate a schematic top view of the prove structure

FIG. 1 illustrates a schematic lateral view of an exemplary probe structure 100. Also, FIG. 2 illustrate a schematic top view of the prove structure 100.

The probe structure 100 includes multiple metal layers, e.g., metal layers 110, 120 and 130. Each pair of the metal layers is separated by an oxide layer 115. In addition, at least one pair of the metal layers is electrically connected by a via 105. In this way, the at least one pair of the metal layers are mutually conductive.

In some examples, the probe structures metal layers is made of a conductive metal, such as copper, aluminum, tungsten, gold, or silver. Similarly, each the via 105 can be made of a conductive metal that is the same or different from the metal layers' material. Also, each the metal layer and/or the via 105 can be made or the same, partially the same, or different metal materials. In some examples, the via 105 can be partially integrated with its neighboring metal layer.

In some examples, the oxide layer is made of, for example, silicon-dioxide, nitride-oxide, TEOS-oxide (Tetra Ethyl-Ortho-Silicate oxide), a spin-on-glass material, resin, polymer, or an inorganic material. The utilized polymer may be polyimide, PBO, BCB, or ABF.

In some examples, the probe structure 100 is further coated with at least one protection layer 150 at its surface, e.g., at the external side of the metal layer 110 and/or 130. The protection layer 150 is capable of performing anti-oxidization and/or isolation. For anti-oxidation, the at least one protection layer 150 can be made of, for example, metal, passive metal, tungsten or silver. Also, for isolation, the at least one protection layer 150 can be made of polymer or resin. In examples, the at least one protection layer 150 can be made of combination of the abovementioned exemplary materials.

Similarly, the probe structure 100's top view in FIG. 2 represents multiple metal layers 110, 210 and 310 that are interposed by multiple oxide layers 115. In addition, the metal layers 110, 210 and 310 are optionally coupled by at least one via 105.

In summary, the probe structure 100 represents a multi-interposed-layer structure in almost every view. Such that the probe structure 100 introduces itself higher strength that will be explained later.

Figure 3:
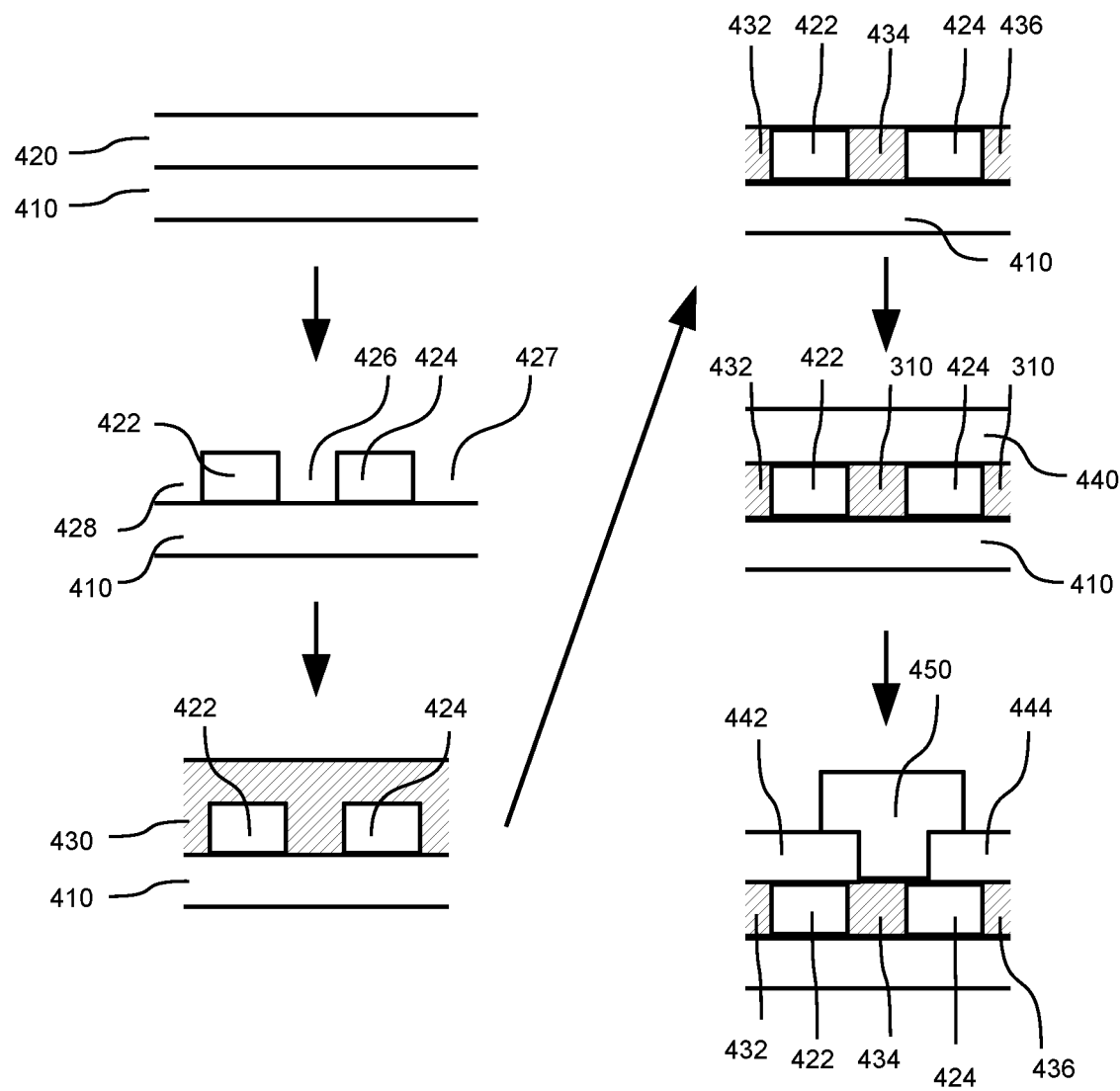
FIG. 3 illustrates an exemplary procedure for fabricating the probe structure shown in FIG. 1 and FIG. 2.

FIG. 3 illustrates an exemplary procedure for fabricating the probe structure 100 shown in FIG. 1 and FIG. 2.

Step 1: First, dispose a wafer layer 410. And then dispose an oxide layer 420 above the wafer layer 410. In some examples, the wafer layer 410 is made of Silicon, and the oxide layer 420 is made of silicon dioxide. The disposition can be performed by various types of film deposition.

Step 2: Etch the oxide layer 420 to form at least one separated oxide portions, e.g., oxide portions 422 and 424. The etching process can be replaced by a chemical-mechanical planarization (CMP) procedure. Moreover, there are trenches formed between the oxide portions after the etching process, for example, trenches 426, 427 and 428.

Step 3: Dispose a metal layer 430 above the oxide portions 422 and 424 and the trenches 426, 427 and 428. Such that the trenches 426, 427 and 428 are filled with the metal layer 430's metal material. In some examples, the metal layer 430 is made of copper or even nanotwinned copper (NT-copper). Also, in some examples, NT-copper is preferred for fabricating the metal layer 430 because of its excellent strength in resisting deformation. In addition, the disposition of the metal layer 430 can be performed by sputtering.

Step 4: Etch the metal layer 430 till reaching the oxide portions 422 and 424. In addition, the etched metal layer 430 is leveled to align with the oxide portions 422 and 424. In this way, the trench 426 is filled with a metal portion 434, the trench 427 is filled with a metal portion 436, and the trench 428 is filled with a metal portion 432. Note that the metal portions 432, 434 and 436 are leftovers of the metal layer 430.

Similarly, the etching and/or leveling processes can be done via the CMP procedure.

Step 5: Dispose an oxide layer 440 to cover the oxide portions 422 and 424 and the metal portions 432, 434 and 436. Similarly, the oxide layer 440 can be made of silicon dioxide. Also, the disposition process can be performed via various types of film deposition. In some examples, the oxide layer 440 can be made of polymer, such as polymide. And the disposition process can be performed by coating or laminating.

Step 6: Etch the oxide layer 440 to form separated oxide portions 442 and 444. And a trench is formed between the oxide portions 442 and 444. In addition, dispose a metal gate portion 450 to fill beyond the trench between the oxide portions 442 and 444. Such that a via (i.e., the metal gate portion 450) is defined on the probe structure 100.

If more layers and vias are required on the probe structure 100, Step 3 and Step 4 can be recursively performed until reaching required layers and vias.

As mentioned before, the probe structure 100 has a multi-interposed-layer structure for better strength. Specifically, the multi-interposed-layer structure has better rigidity at its outer portion and better flexibility at its inner portion in response to an external bending force. Moreover, such multi-interposed-layer structure has better endurance against thermal expansion and contraction.

Figure 4:
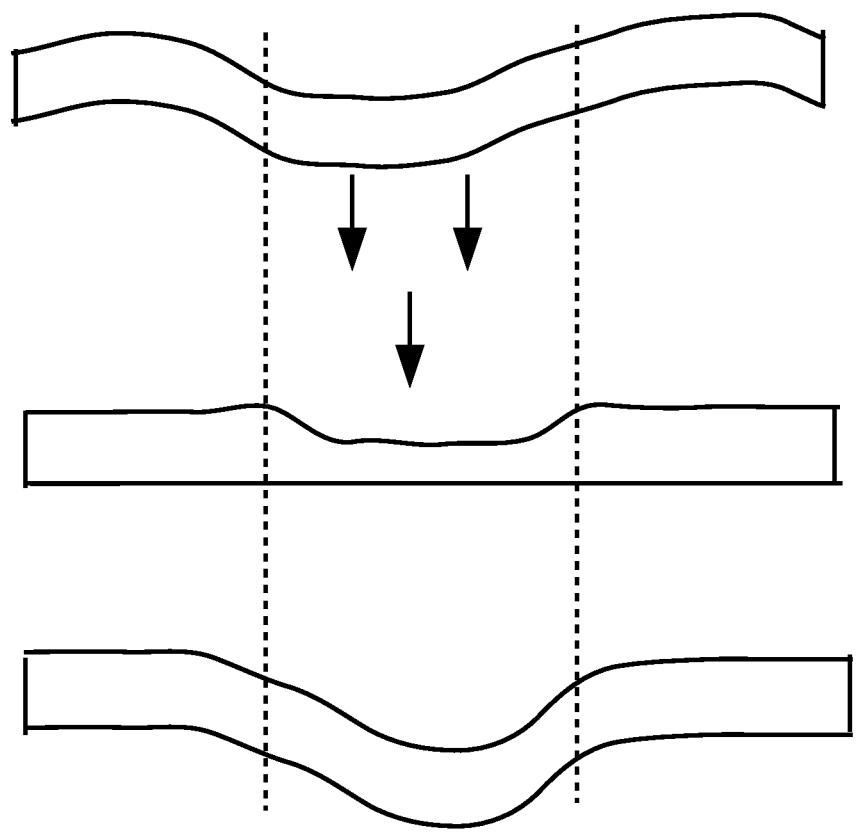
FIG. 4 illustrates removing certain vias from the probe structure.

In some examples, for better response to the external bending force, the probe structure 100 may remove its certain vias 105 at designed location(s). Such that the probe structure 100's curve may occur only at said designed location(s). FIG. 4 illustrates removing certain vias 105 from the probe structure 100 such that the probe structure 100's curve occurs only at the designed locations.

By controlling such curves, the probe structure 100's surface area is increased. Then, the probe structure 100's total resistance is reduced correspondingly. It is because the probe structure 100's larger surface area introduces a skin effect at its surface, especially when the probe structure 100 is activated at a higher frequency. As a result, the probe structure 100's lower resistance at higher frequency aids significantly in its high-frequency tests.

In some examples, the probe structure 100's controlled curve location(s) can also be designed via its thickness and/or shape, as long as the probe structure 100's head and tail are parallel to each other.

Figure 5:
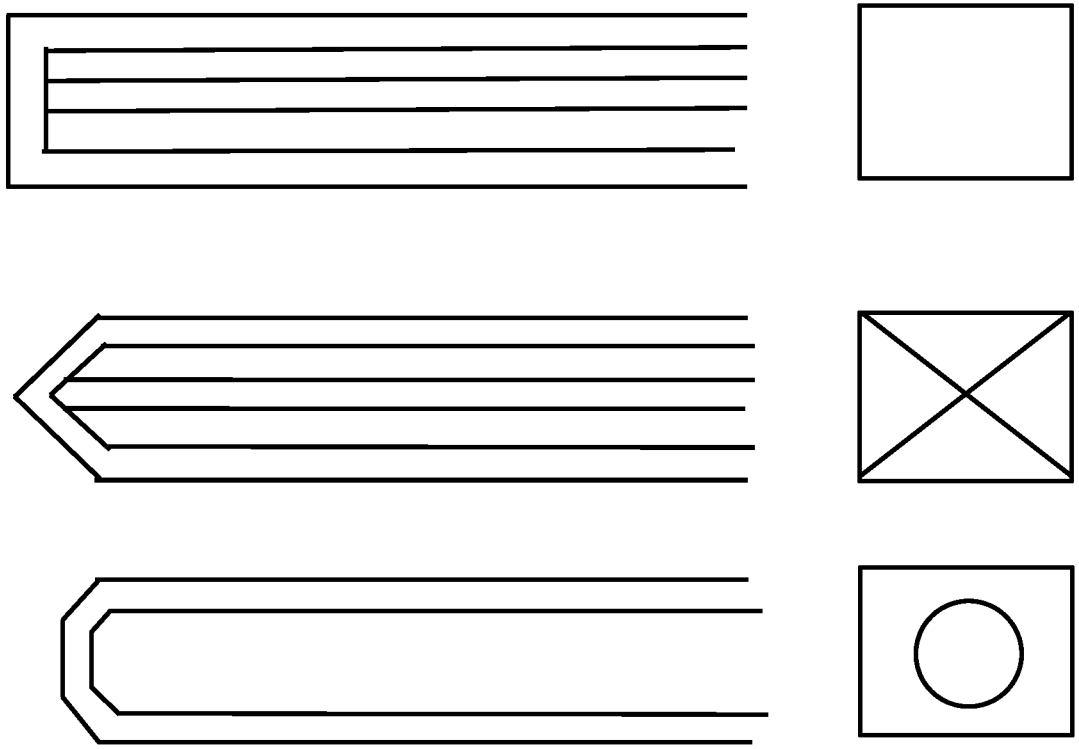
FIG. 5 illustrates options of the probe structure.

FIG. 5 illustrates options of the probe structure 100's tip (head or tail) shapes, including: (1) a flat surface; (2) a cone body and a pinpoint that connects the cone body; or (3) a capped cone body and a flat pinpoint that connects the capped cone body. Also, the probe structure 100's tip is designed to substantially contact a to-be-tested chip for complete testing. Specifically, FIG. 5's left side illustrates a lateral view of the optional probe structure 100's shapes. And FIG. 5's right side illustrates a top view of the optional probe structure 100's shapes.

Figure 6:
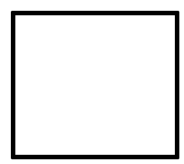
FIG. 6 also illustrates options of the probe structure 100's cross-sectional shape.
Figure 6:
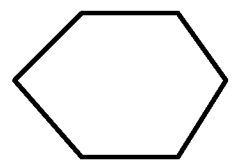
Figure 6:
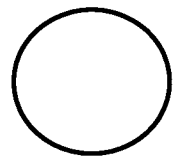
Figure 6:

FIG. 6 also illustrates options of the probe structure 100's cross-sectional shape, that may include a trapezoid, a hexagon, a circle, or an octagon.

Exemplarily, the probe structure 100 may be shaped into a cuboid, a cylinder, or a curved cylinder.

In some examples, the probe structure 100's tip shape may be pillar-shaped or curve-shaped.

Figure 7:
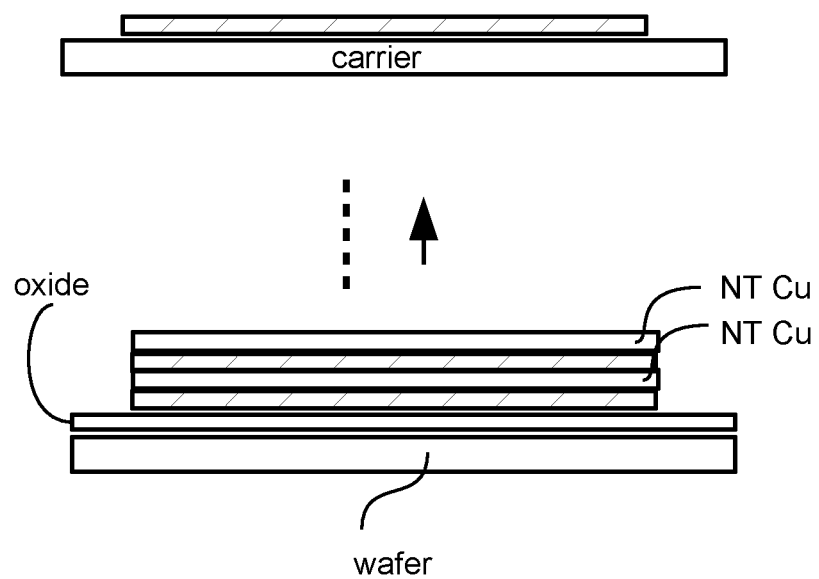
FIG. 7 illustrates a schematic diagram of the probe structure dimension.

FIG. 7 illustrates a schematic diagram of the probe structure 100's dimension (e.g. 40 micro-meters in thickness) and how to increase its number of layers.

Figure 8:
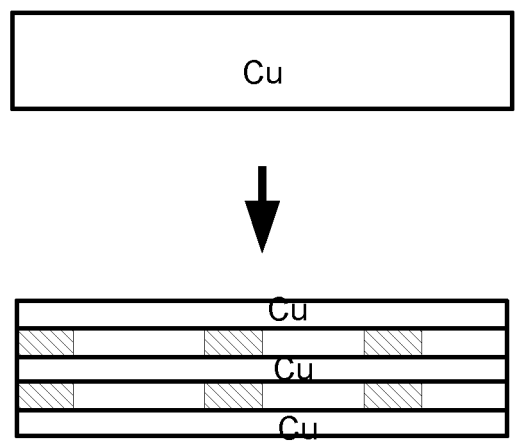
FIG. 8 illustrates a schematic diagram of the probe structure detailed multi-interposed-layer structure.

FIG. 8 illustrates a schematic diagram of the probe structure 100's detailed multi-interposed-layer structure.

Figure 9:
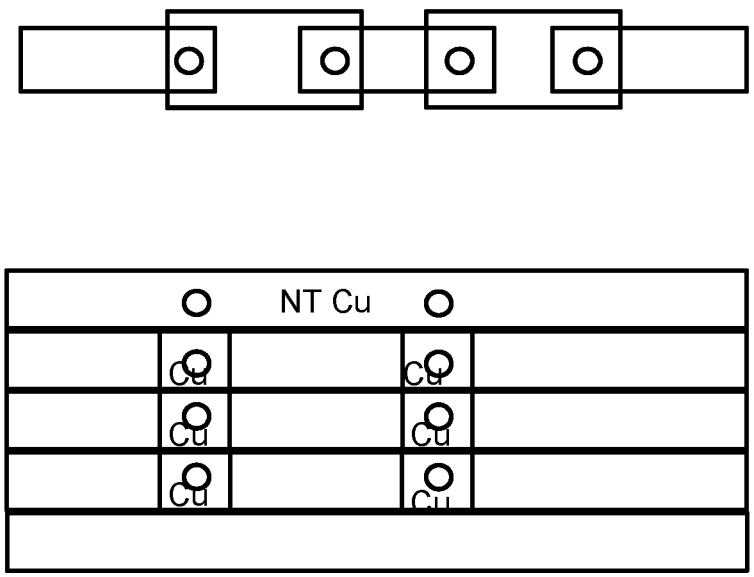
FIG. 9 illustrates a schematic diagram of the probe structure.

FIG. 9 illustrates a schematic diagram of the probe structure 100 that regards layers between vias as sections. And the probe structure 100 can be programmed by activating a section or not. Specifically, each section can be activated by connecting both vias at its tails, or can be disabled by disconnecting at least one of its vias.

Figure 10:
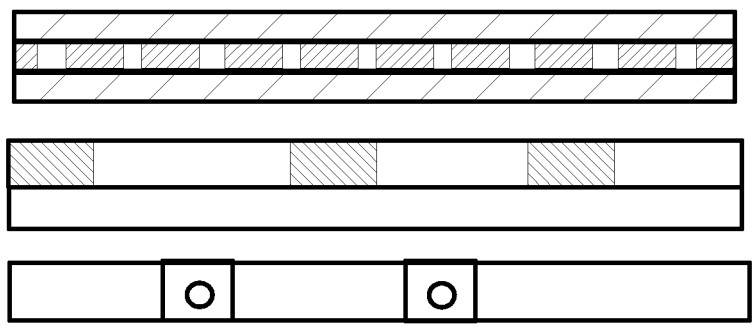
FIG. 10 illustrates a schematic diagram of the probe structure.

FIG. 10 illustrates a schematic diagram of the probe structure 100 that has various exemplary internal arrangement.

Figure 11:
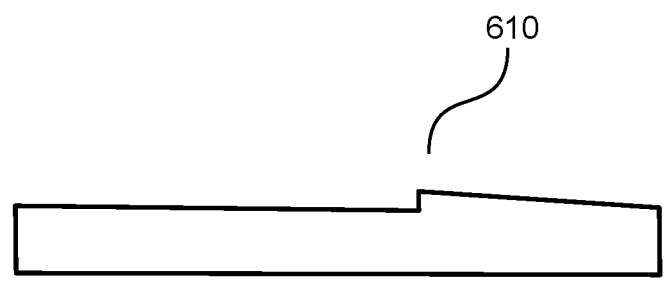
FIG. 11 illustrates an exemplary schematic diagram of the probe structure.

The probe structure 100's practical usage is combined with a probe card. More specifically, the probe structure 100 requires engagement with the probe card. For such purpose, the probe structure 100 has at least one latch 610 for detachably or fixedly engaged (e.g. clamped) with a probe card. Therefore, the probe card is capable of testing a chip via the probe structure 100. FIG. 11 illustrates an exemplary schematic diagram of the probe structure 100 that equips with at least one latch 610.

Figure 12:
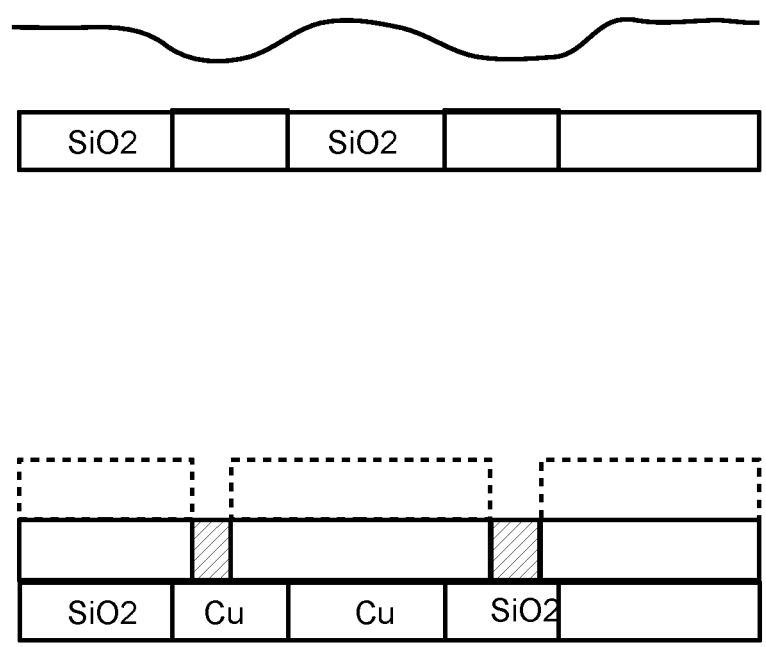
FIG. 12 illustrates an exemplary diagram of performing the Dual Damascence process.

Also, in some examples, Step 3 and Step 4 shown in FIG. 3 can be completed by performing the Dual Damascence process on the metal layer 430. FIG. 12 illustrates an exemplary diagram of performing the Dual Damascence process on depositing the metal layer 430, which may be a copper layer. For example, the copper layer can be deposited via a physical vapor deposition (PVD), chemical vapor deposition (CVD) or sputtering. And in turn, the deposited copper layer is etched via chemical mechanical planarization (CMP).

As mentioned before, the probe structure 100 may have designed locations for flexible bending. In some examples, the probe structure 100 may use such bending to form a twisted structure. Such that the probe structure 100 may additionally has the capability of anti-vibration. FIGS. 13-17 explains how the probe structure 100 forms the twisted structure.

Figure 13:
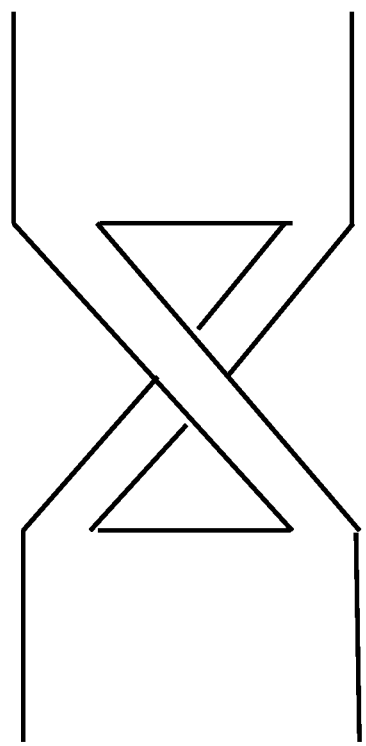
FIG. 13 illustrates a top view of the probe structure twisted structure.
Figure 14:
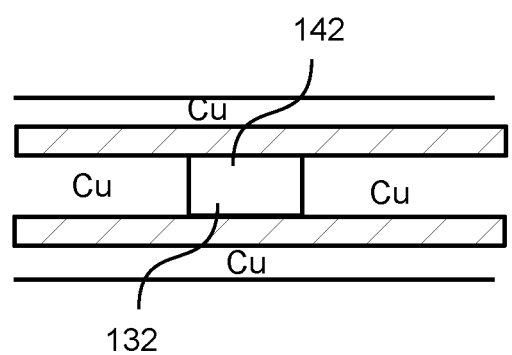
FIG. 14 provides a lateral view for the probe structure.

FIG. 13 illustrates a top view of the probe structure 100's twisted structure. And FIG. 14 provides a lateral view for the probe structure 100's twisted structure. Specifically and exemplarily, the abovementioned technique of forming curves can be applied to form an upper curved layer 132, a lower curved layer 134, and a void 142 in between. Furthermore, the upper curved layer 132 and the lower curved layer 134 are twisted along a Z-axis, i.e., a coaxial axis to the probe structure 100.

By partially occupying the void 142's space, the upper curved layer 132 crossed the lower curved layer 134 in an overlapped manner (e.g. by an angle of substantially 90, i.e., in a mutually-vertical manner) and thus together form a twisted structure. While the probe structure 100 confronts vibrations, such twisted structure can uniformly distribute vibration forces along the probe structure 100. In this way, the probe structure 100 can be substantially free from breakage caused by vibrations.

Figure 15:
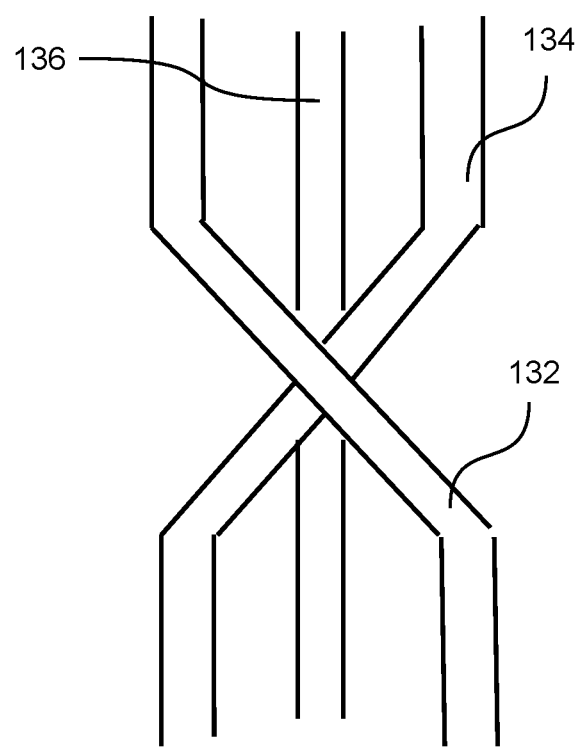
FIG. 15 shows another example of the probe structure twisted structure.
Figure 16:
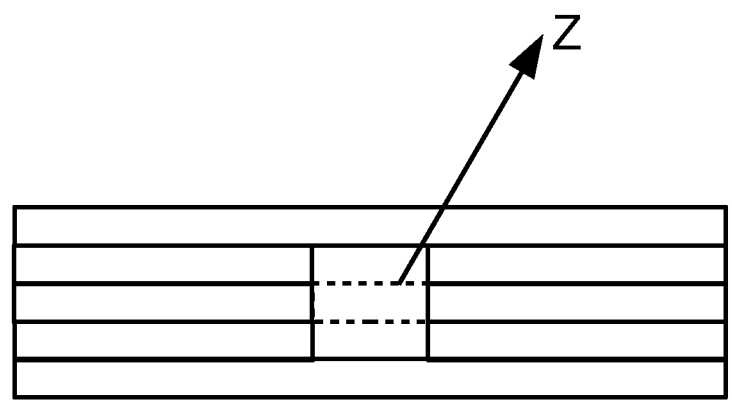
FIG. 16 shows an embodiment of the semiconductor probe.

FIG. 15 shows another example of the probe structure 100's twisted structure. Specifically, at least one central curved layer 136 is formed along the Z-axis and between the upper curved layer 132 and the lower curved layer 134. Such that the central curved layer 136 stays within the void 142. While bending the curved layers 132 and 134, the central curved layer 136 is not substantially bent. In this fashion, the central curved layer 136 strengthens the probe structure 100's central strength without obstructing the curved layers 132 and 134 to form the twisted structure.

Figure 17:
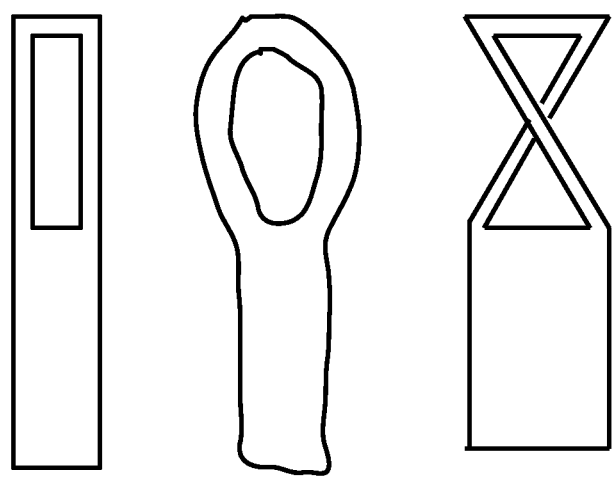
FIG. 17 schematically shows a simplified method to fabricate such twisted structure.

FIG. 17 schematically shows a simplified method to fabricate such twisted structure during formation of the probe structure 100.

The invention claimed is:

1. A semiconductor probe comprising:
   multiple metal layers, wherein an oxide layer is disposed between each adjacent pair of the metal layers;
   a tip; and
   a via for connecting at least one pair of the metal layers;
   wherein a first one metal layer of the multiple metal layers has a first curve layer;
   wherein a second one metal layer of the multiple metal layers has a second curve layer; and
   wherein a void is formed between the first curve layer and the second curve layer.

2. The semiconductor probe of claim 1, wherein at least one protection layer is disposed at an external side of the metal layer.

3. The semiconductor probe of claim 1, wherein the first curve layer and the second curve layer form a twisted structure.

4. The semiconductor probe of claim 1, wherein at least one metal layer comprises nanotwinned copper.

5. The semiconductor probe of claim 1, wherein the tip comprises a cone body structure and a pinpoint that connects to the cone body structure.

6. The semiconductor probe of claim 1, wherein the tip comprises a capped cone body and a flat pinpoint that connects to the capped cone body.

7. The semiconductor probe of claim 2, wherein the protection layer provides anti-oxidization and isolation.

8. The semiconductor probe of claim 7, wherein the at least one protection layer is made of polymer or resin.

9. A semiconductor probe comprising:
   a first metal layer;
   a second metal layer; and
   an oxide layer located between the first metal layer and the second metal layer;
   wherein the first metal layer comprises a first curve layer;
   wherein the second metal layer comprises a second curve layer; and
   wherein the first curve layer and the second curve layer form a twisted structure.

10. The semiconductor probe of claim 9, wherein at least one protection layer is disposed at an external side of the first metal layer.

11. The semiconductor probe of claim 10, wherein the protection layer provides anti-oxidization and isolation.

12. The semiconductor probe of claim 11, wherein the at least one protection layer is made of polymer or resin.

13. The semiconductor probe of claim 9, wherein the first curve layer and the second curve layer form a void.

14. The semiconductor probe of claim 9, wherein the first metal layer comprises nanotwinned copper.

15. The semiconductor probe of claim 9, further comprising a tip, the tip comprising a cone body structure and a pinpoint that connects to the cone body structure.

16. The semiconductor probe of claim 9, further comprising a tip, the tip comprising a capped cone body and a flat pinpoint that connects to the capped cone body.

* * * * *